United States Patent
Jiang et al.

(10) Patent No.: US 7,902,556 B2
(45) Date of Patent: Mar. 8, 2011

(54) METHOD FOR FABRICATING HIGH-QUALITY SEMICONDUCTOR LIGHT-EMITTING DEVICES ON SILICON SUBSTRATES

(75) Inventors: Fengyi Jiang, Nanchang (CN); Bilin Shao, Jiang Xi (CN); Li Wang, Jiang Xi (CN); Wenqing Fang, Jiang Xi (CN)

(73) Assignee: Lattice Power (Jiangxi) Corporation, Nanchanj (CN)

( * ) Notice: Subject to any disclaimer, the term of this patent is extended or adjusted under 35 U.S.C. 154(b) by 248 days.

(21) Appl. No.: 12/067,690

(22) PCT Filed: Nov. 17, 2006

(86) PCT No.: PCT/CN2006/003098
§ 371 (c)(1),
(2), (4) Date: Mar. 21, 2008

(87) PCT Pub. No.: WO2007/056956
PCT Pub. Date: May 24, 2007

(65) Prior Publication Data
US 2008/0210951 A1    Sep. 4, 2008

(30) Foreign Application Priority Data

Nov. 17, 2005 (CN) .......................... 2005 1 0110566

(51) Int. Cl.
*H01L 33/00* (2010.01)
(52) U.S. Cl. .............................................. 257/79; 438/46
(58) Field of Classification Search ................... 257/79
See application file for complete search history.

(56) References Cited

U.S. PATENT DOCUMENTS
2004/0104395 A1 * 6/2004 Hagimoto et al. .............. 257/79
* cited by examiner

*Primary Examiner* — David Vu
*Assistant Examiner* — Suberr Chi
(74) *Attorney, Agent, or Firm* — Park, Vaughan, Fleming & Dowler LLP; Shun Yao

(57) ABSTRACT

One embodiment of the present invention provides a semiconductor light-emitting device which includes: (1) a silicon (Si) substrate; (2) a silver (Ag) transition layer which is formed on a surface of the Si substrate, wherein the Ag transition layer covers the Si substrate surface; and (3) an InGaAlN, ZnMgCdO, or ZnBeCdO-based semiconductor light-emitting structure which is fabricated on the Ag-coated Si substrate. Note that the Ag transition layer prevents the Si substrate surface from forming an amorphous overcoat with reactant gases used for growing the semiconductor light-emitting structure.

7 Claims, 2 Drawing Sheets

METHOD FOR FABRICATING HIGH-QUALITY SEMICONDUCTOR LIGHT-EMITTING DEVICES ON SILICON SUBSTRATES

BACKGROUND

1. Field of the Invention

The present invention relates to the design of semiconductor light-emitting devices. More specifically, the present invention relates to a method for fabricating high-quality semiconductor light-emitting devices on silicon substrates.

2. Related Art

Solid-state light-emitting devices are expected to be the illumination wave of the future. High-brightness light-emitting diodes (HB-LEDs) are emerging in an increasing number of applications, from light source for display devices to light-bulb replacement for conventional lighting. Meanwhile, solid-state lasers continue to beam as the driving force in many critical technological fields, from optical data storage, to optical communication networks, and to medical applications.

In recent years, an increasing demand has emerged for blue light-emitting devices, which include both blue LEDs and blue lasers. These blue light-emitting devices are generally based on wide band-gap semiconductor materials, such as the nitride-based $In_xGa_yAl_{1-x-y}N$ ($0<=x<=1, 0<=y<=1$) materials and zinc oxide-based $Zn_xMg_yCd_{1-x-y}O$ ($0<=x<=1, 0<=y<=1$) or $Zn_xBe_yCd_{1-x-y}O$ ($0\leq x\leq 1, 0\leq y\leq 1$) materials, which both are under intense development worldwide. In particular, recent success in the development of nitride-based LEDs and lasers (e.g., GaN-based LEDs and lasers) not only extends the light-emission spectrum to the green, blue, and ultraviolet region, but also can achieve high light emission efficiency.

Successful epitaxial growth of nitride-based materials typically requires matching of the lattice constant and thermal-expansion coefficients of the substrate and epitaxial layers. Consequently, unconventional substrate materials, such as sapphire ($Al_2O_3$), gallium arsenide (GaAs), gallium phosphide (GaP), and silicon carbide (SiC), are often used to grow InGaAlN, ZnMgCdO, and ZnBeCdO materials in order to achieve such matching.

However, these unconventional substrates are typically expensive and not available in large diameters. For example, the high costs make SiC substrates unsuitable for large-volume commercial production. Another problem associated with these substrates, with Sapphire substrate in particular, is that they have low electrical and thermal conductivity. As a result, a light-emitting device fabricated on such substrates often requires both positive and negative electrodes to be on the same side of the substrate. However, this lateral-electrode configuration can reduce light-emitting efficiency, increase fabrication complexity, and limit heat dissipation during operation. Hence, it is desirable to find a substrate material which is of low cost, is highly conductive, and facilitates easy fabrication.

Although being the most mature and widely used semiconductor material in semiconductor industry, Silicon (Si) has an indirect energy bandgap and is therefore considered to be unsuitable if used directly as light-emitting materials. Hence, Si has seen very limited use in light-emitting applications in the past. Nevertheless, many research efforts have been attempted to integrate Si with light-emitting devices. Recent successes from these efforts have allowed semiconductor light-emitting materials to be fabricated on conventional Si substrate.

The latest research efforts have been focusing on using Si substrates to manufacture nitride-based light-emitting devices. As a substrate material, silicon has both good electrical and thermal conductivity. Furthermore, the costs of silicon substrates are significantly lower than the costs of sapphire or SiC substrates. It also enables integration of light-emitting devices with Si-based electronics.

Unfortunately, using Si substrate to fabricate InGaAlN and ZnMgCdO based devices faces a serious problem. When exposed to reactant gases containing group-V or group-VI elements (e.g., gases containing N or O, which are typically used in metal organic chemical vapor deposition, MOCVD), Si atoms on the substrate surface can easily react with these elements. The reactions result in an amorphous overcoat formed on top of the substrate surface, which can degrade the quality for subsequent film growth. For example, an amorphous $SiN_x$ overcoat tends to form prior to the formation of $In_xGa_yAl_{1-x-y}N$ based layers, and an amorphous $SiO_2$ overcoat tends to form prior to the formation of $Zn_xMg_yCd_{1-x-y}O$ or $Zn_xBe_yCd_{1-x-y}O$ based layers. Furthermore, this amorphous overcoat is difficult to remove, and therefore is detrimental to the subsequent fabrication of the light-emitting structure.

To solve the above-described problem, one can deposit an Al transition layer on the Si substrate prior to the growth of $In_xGa_yAl_{1-x-y}N$, $Zn_xMg_yCd_{1-x-y}O$, or $Zn_xBe_yCd_{1-x-y}O$ based material. The Al transition layer can prevent the oxidation or the nitridation of the Si substrate. However, Al is known to be chemically active. This instability can complicate the overall fabrication process and cause potential issues on device reliability.

Hence, what is needed is a method for preparing Si substrates for fabricating high-quality semiconductor light-emitting structures without above-described problems.

SUMMARY

One embodiment of the present invention provides a semiconductor light-emitting device which includes: (1) a silicon (Si) substrate; (2) a silver (Ag) transition layer which is formed on a surface of the Si substrate, wherein the Ag transition layer covers the Si substrate surface; and (3) an InGaAlN, ZnMgCdO, or ZnBeCdO-based semiconductor light-emitting structure which is fabricated on the Ag-coated Si substrate. Note that the Ag transition layer prevents the Si substrate surface from forming an amorphous overcoat with reactant gases used for growing the semiconductor light-emitting structure.

In a variation of this embodiment, the Ag transition layer comprises one or more Ag monolayers.

In a variation of this embodiment, the Ag transition-layer thickness is not less than 2 angstroms and not more than 50 angstroms.

In a variation of this embodiment, the Ag transition-layer thickness is not less than 5 angstroms and not more than 20 angstroms.

In a variation of this embodiment, the Ag transition layer is formed on the Si substrate surface by using one of the following techniques: (1) electron beam evaporation; (2) chemical vapor deposition; (3) physical vapor deposition; (4) sputtering deposition; and (5) electroplating.

In a variation of this embodiment, the semiconductor light-emitting device comprises one or multiple metallic-transition layers, which is formed on the Ag-coated Si substrate prior to growing the semiconductor light-emitting structure.

In a further variation of this embodiment, each metallic transition layer can be: an aluminum (Al) layer; a titanium (Ti) layer; or an Al and Ti alloy layer.

In a variation of this embodiment, the Si substrate is a (111) Si substrate.

In a variation of this embodiment, the semiconductor light-emitting structure can include a number of $In_xGa_yAl_{1-x-y}N$ ($0 \leq x \leq 1$, $0 \leq y \leq 1$) layers, a number of $Zn_xMg_yCd_{1-x-y}O$ ($0 \leq x \leq 1$, $0 \leq y \leq 1$) layers, or a number of $Zn_xBe_yCd_{1-x-y}O$ ($0 \leq x \leq 1$, $0 \leq y \leq 1$) layers.

In a further variation of this embodiment, the semiconductor light-emitting structure comprises one of the following structures: a P—N junction; a double heterojunction (DH); and a multi-quantum well (MQW) structure.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Overview

The present invention facilitates fabricating high-quality light-emitting devices on a Si substrate by preventing the substrate surface from being exposed to a reactive gas environment. Specifically, a silver (Ag) transition layer is first deposited on a previously cleaned Si substrate prior to fabricating semiconductor light-emitting structures on the substrate. As a result, the Si substrate surface does not interact with the reactant gases to form an amorphous oxidation or nitridation layer on the substrate, thereby improving the quality of light-emitting thin films.

Note that the semiconductor light-emitting structures in the present invention can include $In_xGa_yAl_{1-x-y}N$ ($0 \leq x \leq 1$, $0 \leq y \leq 1$), $Zn_xMg_yCd_{1-x-y}O$ ($0 \leq x \leq 1$, $0 \leq y \leq 1$), or $Zn_xBe_yCd_{1-x-y}O$ ($0 \leq x \leq 1$, $0 \leq y \leq 1$) materials. Each type of these materials can be a binary, ternary, or quaternary compound. For example, an $InGa_yAl_{1-x-y}N$ material can include GaN, InGaN, GaAlN, and InGaAlN. Furthermore, embodiments of the present invention are applicable to a wide range of semiconductor devices, including, but not limited to, LEDs, semiconductor lasers, and integrated circuits.

Using a Ag Transition Layer Between Si Substrate and Light-Emitting Structure

Figure 1:
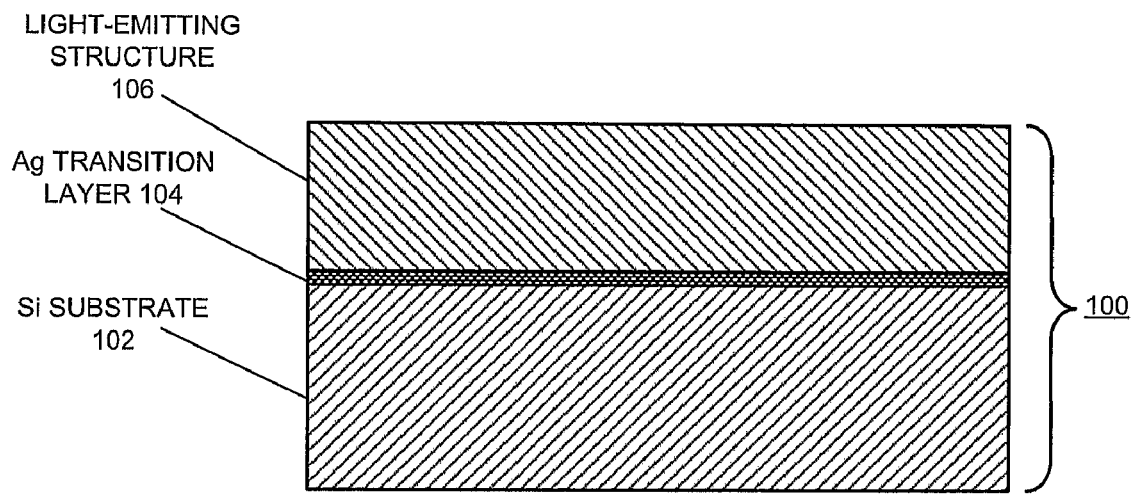
FIG. 1 illustrates a cross-sectional view of a light-emitting device fabricated on Si substrate in accordance with one embodiment of the present invention.

FIG. 1 illustrates a cross-sectional view of a light-emitting device fabricated on Si substrate in accordance with one embodiment of the present invention. On the bottom of a structure 100 is a Si substrate 102. In one embodiment of the present invention, Si substrate 102 is (111)-Si, which has a diamond-like hexagonal crystalline structure.

Next, a thin Ag transition layer 104 is formed on Si substrate 102. Note that Ag transition layer 104 can be as thin as comprising only a few atom layers. Ideally, Ag transition layer 104 contains sufficient Ag atoms to uniformly cover the entire Si substrate without leaving pinholes, thereby effectively isolating the Si surface from any reactant gases in the subsequent fabrication process. This is due to the good wettability of Ag to (111) Si. Furthermore, the Ag atoms tend to spread over the Si surface without forming clusters, thereby allowing uniform growth of subsequent structures.

Note that when a thin Ag layer is deposited on a (111) Si substrate, the Ag layer typically inherits the arrangement and orientation of the silicon atoms, thereby extending the crystalline structure of the (111) Si substrate. This is a highly desirable feature because both InGaAlN and ZnMgCdO (or ZnBeCdO) thin films have a hexagonal Wurtzite crystalline structure with a preferred stable growth surface in the (0001) direction. For lattice matching purposes, these materials are ideally grown on a substrate surface that exhibits a hexagonal symmetry as well. Therefore, having an Ag transition layer that maintains the (111) silicon atomic arrangement is beneficial to the subsequent growth of high-quality crystal structures.

The thickness of Ag transition layer 104 is critically important for achieving its designed functions. Ideally, this layer is sufficiently thick. If grown too thin, Ag transition layer 104 cannot provide adequate protection of the Si substrate surface due to inadequate uniformity and the presence of pinholes. Typically, a thickness of at least a few atomic layers or monolayers is desired. On the other hand, an overly-thick Ag layer cannot extend the crystalline structure of the (111) Si substrate, and may fail to maintain the long-range order of the desired crystalline structure. In one embodiment, the thickness of Ag transition layer 104 can be anywhere between 2 angstroms and 50 angstroms. In a further embodiment, the range of Ag layer thickness can be between 5 angstroms and 20 angstroms.

Note that Ag transition layer 104 can be formed on the Si substrate by using one of the following techniques: electron beam evaporation, chemical vapor deposition, physical vapor deposition, sputtering deposition, electroplating, and other thin film deposition techniques. In one embodiment of the present invention, depositing Ag transition layer 104 on Si substrate 102 can be performed at a separate location from the chamber for fabricating light-emitting structures. In another embodiment of the present invention, preparation of the Ag transition layer 104 can be integrated with the fabrication of the semiconductor light-emitting structures in the same fabrication chamber.

Next, as is shown in FIG. 1, a semiconductor light-emitting structure 106 is formed on Ag transition layer 104, wherein structure 106 can include $In_xGa_yAl_{1-x-y}N$ ($0 \leq x \leq 1$, $0 \leq y \leq 1$), $Zn_xMg_yCd_{1-x-y}O$ ($0 \leq x \leq 1$, $0 \leq y \leq 1$), or $Zn_xBe_yCd_{1-x-y}O$ ($0 \leq x \leq 1$, $0 \leq y \leq 1$) layers. Note that semiconductor light-emitting structure 106 can comprise either a single layer of light-emitting material or a multilayer stack of light-emitting materials, wherein each layer of light-emitting material can be either doped or undoped. Furthermore, semiconductor light-emitting structure 106 can include the following structures: a P—N junction; a double heterojunction (DH); a multi-quantum well structure (MQW); or any other light-emitting microstructures.

$In_xGa_yAl_{1-x-y}N$, $Zn_xMg_yCd_{1-x-y}O$, or $Zn_xBe_yCd_{1-x-y}O$ materials can be fabricated on Ag coated Si substrate 102 using any known deposition techniques, which can include: physical vapor deposition (PVD), chemical vapor deposition (CVD), metal organic CVD (MOCVD), plasma enhanced CVD (PECVD), molecular beam epitaxy (MBE), halide vapor phase epitaxy (HVPE), or other suitable deposition methods. To obtain high crystal quality, this fabrication process typically contains two steps. In the first step, a semiconductor buffer layer is formed at a relatively low temperature. In the second step, the temperature is increased to a suitable condition to grow the epitaxy layer, and other microstructures required for the device.

In one embodiment of the present invention, one or more metallic transition layers can be inserted between Ag transition layer 104 and light-emitting structure 106. Each additional transition layer can be made of aluminum (Al), titanium (Ti), magnesium (Mg), or an alloy comprising two or more of these metals, for example, an Al and Ti alloy.

Exemplary Fabrication Processes

Figure 2:
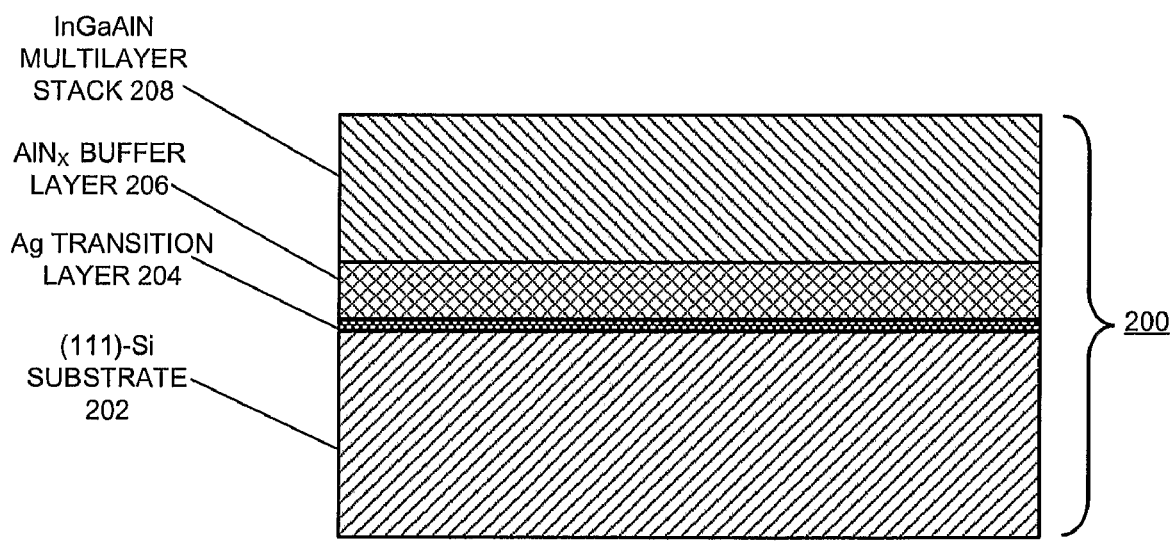
FIG. 2 illustrates a cross-sectional view of an $In_xGa_yAl_{1-x-y}N$-based light-emitting epitaxial structure fabricated on a (111) Si substrate in accordance with one embodiment of the present invention.

FIG. 2 illustrates a cross-sectional view of an $In_xGa_yAl_{1-x-y}N$-based light-emitting epitaxial structure 200 fabricated on a (111) Si substrate in accordance with one embodiment of the present invention.

To fabricate structure 200, a (111)-Si substrate 202 is first cleaned before it is placed inside an electron-beam evaporator. Next, a 10-angstrom thick Ag overcoat is formed on the bare Si substrate through the electron-beam evaporation process to form a Ag transition layer 204. The Ag-coated Si substrate is then placed inside an MOCVD reaction chamber. Prior to further deposition, the substrate surface is treated with $H_2$ gas at 1050° C. for five minutes. The temperature is then reduced to 800° C. and a 200-angstrom $AlN_x$ low-temperature buffer layer 206 is deposited on Ag transition layer 204. Next, the temperature is increased again, and an $In_xGa_yAl_{1-x-y}N$ multi-layer structure 208 is fabricated on top of buffer layer 206. In one embodiment of the present invention, $In_xGa_yAl_{1-x-y}N$ multi-layer structure 208 comprises the following layers from the bottom to the top of the structure (not shown): an undoped GaN layer, a Si-doped GaN layer, a InGaN/GaN MQW active layer, and a Mg-doped GaN layer.

Figure 3:
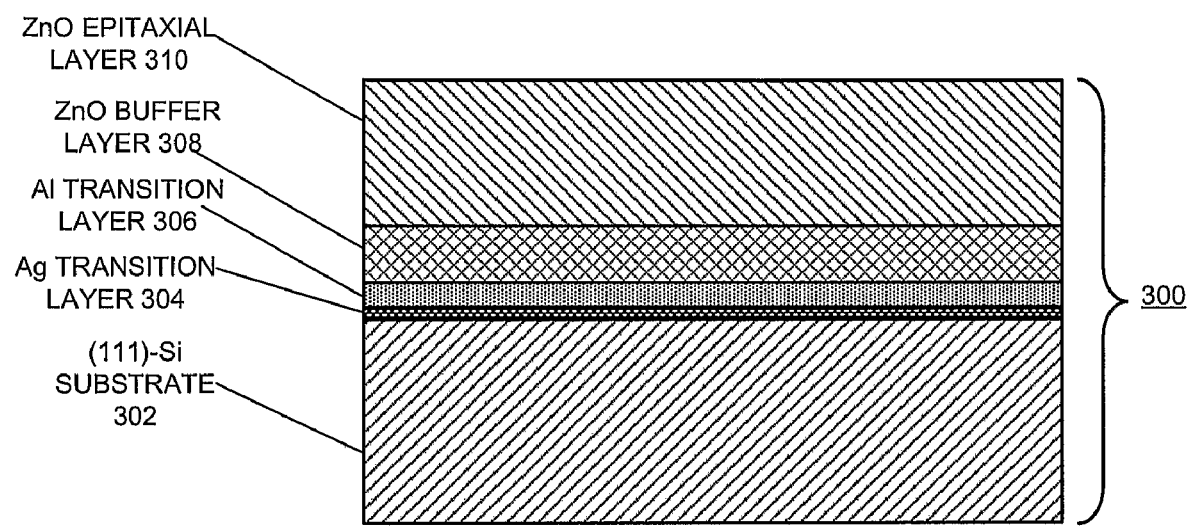
FIG. 3 illustrates a cross-sectional view of a $Zn_xMg_yCd_{1-x-y}O$ or $Zn_xBe_yCd_{1-x-y}O$-based light-emitting epitaxial structure fabricated on a (111) Si substrate in accordance with one embodiment of the present invention.

FIG. 3 illustrates a cross-sectional view of a $Zn_xMg_yCd_{1-x-y}O$ or $Zn_xBe_yCd_{1-x-y}O$-based light-emitting epitaxial structure 300 fabricated on a (111) Si substrate in accordance with one embodiment of the present invention.

To fabricate this structure, a Si (111) substrate 302 is cleaned before it is placed inside an MOCVD reaction chamber. Prior to any deposition, the substrate surface is treated with $H_2$ gas at 1000° C. for five minutes. The temperature is then reduced to 200° C. and a 10-angstrom thick Ag overcoat is deposited on (111) Si substrate 302 to form a Ag transition layer 304. While the temperature is maintained at 200° C., a 10-angstrom thick Al transition layer 306 is then deposited on top of Ag transition layer 304.

Next, a 300-angstrom ZnO low-temperature buffer layer 308 is deposited on Al transition layer 306 at 200° C. The temperature is then increased to 700° C., and a ZnO epitaxial layer 310 is formed on low temperature ZnO buffer layer 308.

Note that the present invention can generally be applied to any $In_xGa_yAl_{1-x-y}N$, $Zn_xMg_yCd_{1-x-y}O$, or $Zn_xBe_yCd_{1-x-y}O$ based light-emitting device fabricated on (111) Si substrate and is not meant to be limited to the exemplary fabrication processes and structures illustrated in FIG. 2 and FIG. 3.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A semiconductor light-emitting device, comprising:
   a Si substrate;
   a silver (Ag) transition layer which is formed on a surface of the Si substrate, wherein the Ag transition layer covers the Si substrate surface, wherein the Ag transition-layer thickness is between 2 and 50 angstroms, and wherein the Ag transition layer exhibits similar lattice structure as the Si substrate; and
   an InGaAlN, ZnMgCdO, or ZnBeCdO-based semiconductor light-emitting structure which is epitaxially grown on the Ag-coated Si substrate, wherein the InGaAlN, ZnMgCdO, or ZnBeCdO-based semiconductor light-emitting structure is in contact with the Ag transition layer,
   whereby the Ag transition layer prevents the Si substrate surface from forming an amorphous overcoat with reactant gases used for growing the semiconductor light-emitting structure.

2. The semiconductor light-emitting device of claim 1, wherein the Ag transition layer comprises one or more Ag monolayers.

3. The semiconductor light-emitting device of claim 1, wherein the Ag transition-layer thickness is not less than 5 angstroms and not more than 20 angstroms.

4. The semiconductor light-emitting device of claim 1, wherein the Ag transition layer is formed on the Si substrate surface by using one of the following techniques:
   electron beam evaporation;
   chemical vapor deposition;
   physical vapor deposition;
   sputtering deposition; and
   electroplating.

5. The semiconductor light-emitting device of claim 1, wherein the Si substrate is a (111) Si substrate.

6. The semiconductor light-emitting device of claim 1, wherein the semiconductor light-emitting structure can include:
   a number of $In_xGa_yAl_{1-x-y}N$ ($0 \leq x \leq 1$, $0 \leq y \leq 1$) layers; or
   a number of $Zn_xMg_yCd_{1-x-y}O$ ($0 \leq x \leq 1$, $0 \leq y \leq 1$) layers; or
   a number of $Zn_xBe_yCd_{1-x-y}O$ ($0 \leq x \leq 1$, $0 \leq y \leq 1$) layers.

7. The semiconductor light-emitting device of claim 6, wherein the semiconductor light-emitting structure comprises one of the following structures:
   a P—N junction;
   a double heterojunction (DH); and
   a multi-quantum well (MQW) structure.

* * * * *